(12) United States Patent
Jibb

(10) Patent No.: US 6,865,897 B2
(45) Date of Patent: Mar. 15, 2005

(54) METHOD FOR PROVIDING REFRIGERATION USING CAPILLARY PUMPED LIQUID

(75) Inventor: Richard J. Jibb, Amherst, NY (US)

(73) Assignee: Praxair Technology, Inc., Danbury, CT (US)

( * ) Notice: Subject to any disclaimer, the term of this patent is extended or adjusted under 35 U.S.C. 154(b) by 0 days.

(21) Appl. No.: 10/615,914

(22) Filed: Jul. 10, 2003

(65) Prior Publication Data

US 2005/0005617 A1 Jan. 13, 2005

(51) Int. Cl.⁷ .................. F25D 15/00; F28D 15/00
(52) U.S. Cl. .................. 62/119; 62/51.1; 62/98; 165/104.26
(58) Field of Search ............ 62/98, 99, 119, 62/51.1, 6; 165/104.26

(56) References Cited

U.S. PATENT DOCUMENTS

| | | | | |
|---|---|---|---|---|
| 3,490,718 A | * | 1/1970 | Vary | 244/163 |
| 3,638,447 A | * | 2/1972 | Abe | 62/222 |
| 4,470,450 A | * | 9/1984 | Bizzell et al. | 165/104.25 |
| 4,720,981 A | * | 1/1988 | Helt et al. | 62/113 |
| 4,957,157 A | * | 9/1990 | Dowdy et al. | 165/104.27 |
| 5,103,897 A | * | 4/1992 | Cullimore et al. | 165/274 |
| 5,587,880 A | * | 12/1996 | Phillips et al. | 361/687 |
| 5,737,927 A | | 4/1998 | Takahashi et al. | 62/51.1 |
| 5,816,313 A | * | 10/1998 | Baker | 165/41 |
| 5,848,532 A | * | 12/1998 | Gamble et al. | 62/48.2 |
| 5,944,092 A | * | 8/1999 | Van Oost | 165/104.26 |
| 6,116,040 A | * | 9/2000 | Stark | 62/259.2 |
| 6,169,852 B1 | * | 1/2001 | Liao et al. | 392/395 |
| 6,173,577 B1 | | 1/2001 | Gold | 62/51.1 |
| 6,173,761 B1 | | 1/2001 | Chandratilleke et al. | 165/104.21 |
| 6,192,690 B1 | | 2/2001 | Stautner | 62/6 |
| 6,205,812 B1 | * | 3/2001 | Acharya et al. | 62/607 |
| 6,311,498 B1 | | 11/2001 | Chase | 62/6 |
| 6,374,617 B1 | * | 4/2002 | Bonaquist et al. | 62/6 |
| 6,430,938 B1 | | 8/2002 | Royal et al. | 62/6 |
| 6,453,677 B1 | | 9/2002 | Arman | 62/3.1 |
| 6,477,847 B1 | | 11/2002 | Bonaquist et al. | 62/99 |
| 6,550,255 B2 | | 4/2003 | Rudick et al. | 62/6 |
| 6,550,530 B1 | * | 4/2003 | Bilski | 165/104.26 |

* cited by examiner

Primary Examiner—Denise L. Esquivel
Assistant Examiner—Richard L. Leung
(74) Attorney, Agent, or Firm—Stanley Ktorides

(57) ABSTRACT

A method for providing refrigeration to a refrigeration load such as superconducting equipment while reducing or eliminating potential two phase instability oscillations, wherein refrigeration condenses working fluid which is evaporated from the surface of a porous wick housed in an evaporator to generate a capillary pumping force to drive the condensed working fluid to the evaporator.

15 Claims, 4 Drawing Sheets

METHOD FOR PROVIDING REFRIGERATION USING CAPILLARY PUMPED LIQUID

TECHNICAL FIELD

This invention relates generally to the provision of refrigeration to a refrigeration load, and is particularly advantageous for providing refrigeration to superconducting equipment.

BACKGROUND ART

One generally employed method for providing refrigeration to a refrigeration load is to vaporize liquid working fluid thereby transferring refrigeration from the working fluid to the refrigeration load. A problem which may arise in the operation of such systems is two phase instability which is oscillatory in nature wherein the oscillations can have a large enough amplitude that the liquid working fluid is prevented from reaching the area of heat exchange with the refrigeration load. This situation is sometimes referred to as vapor lock. Systems such as thermo-siphon systems, especially at low absolute pressure, may be particularly susceptible to such two phase instabilities.

One application wherein two phase instabilities are particularly troubling is in the provision of refrigeration to superconducting equipment which operates at very low temperatures, typically below 80K. Refrigeration must be provided to the superconducting equipment on a continuing basis in order to maintain the requisite very cold conditions for sustaining the superconductivity. Any loss of refrigeration due to two phase instability would quickly result in loss of superconductivity with potentially devastating consequences.

Accordingly, it is an object of this invention to provide a method for providing refrigeration to a refrigeration load, particularly low temperature refrigeration such as is required for sustaining superconducting conditions, wherein two phase instabilities are reduced or even eliminated.

SUMMARY OF THE INVENTION

The above and other objects, which will become apparent to those skilled in the art upon a reading of this disclosure, are attained by the present invention, one aspect of which is:

A method for providing refrigeration to a refrigeration load comprising:

(A) generating refrigeration and using the refrigeration to condense working fluid;

(B) passing the condensed working fluid into an evaporator comprising a porous wick having a surface, providing a refrigeration load to the evaporator, flowing condensed working fluid onto the wick surface, and evaporating condensed working fluid from the wick surface to provide refrigeration to the refrigeration load and to generate a capillary pumping force; and (C) withdrawing evaporated working fluid from the evaporator, wherein the condensed working fluid is passed to the evaporator at least in part by the capillary pumping force from the evaporation of the condensed working fluid from the wick surface.

Another aspect of the invention is:

A method for providing refrigeration to a refrigeration load comprising:

(A) generating refrigeration and using the refrigeration to condense working fluid;

(B) providing refrigeration from the condensed working fluid to the refrigeration load and thereafter passing the condensed working fluid into an evaporator comprising a porous wick having a surface, flowing condensed working fluid onto the wick surface, and evaporating condensed working fluid from the wick surface to generate a capillary pumping force; and (C) withdrawing evaporated working fluid from the evaporator, wherein the condensed working fluid is passed to the evaporator at least in part by the capillary pumping force from the evaporation of the condensed working fluid from the wick surface.

As used herein the term "refrigeration load" means an entity, such as fluid or equipment, which is capable of releasing heat and receiving refrigeration.

As used herein the term "indirect heat exchange" means the bringing of fluids into heat exchange relation without any physical contact or intermixing of the fluids with each other.

As used herein the term "subcool" means to cool a liquid to be at a temperature lower than the saturation temperature of that liquid for the existing pressure.

As used herein the term "cryocooler" means a refrigeration device which is intended to remove heat from a source thereby allowing it to be reduced to and maintained at a very low or cryogenic, i.e. 150K or less, temperature.

As used herein the term "porous wick" means a structure comprising a large number of small diameter channels which allow fluid communication between an inlet and an outlet of the wick.

As used herein the term "metal foam" means a metal that has been treated to form an anisotropic cellular structure with small diameter interconnecting pores.

As used herein the term "capillary pumping force" means the force that causes a liquid to flow in a wick or narrow channel under the influence of its own surface and interfacial properties. The maximum possible capillary pumping force depends on the surface tension of the fluid and on the diameter of the channel.

DETAILED DESCRIPTION

In the practice of this invention a closed thermal loop is used to connect a refrigerator, such as a cryocooler, to a refrigeration load. A working fluid is circulated, at least in part, by a capillary pumping force generated due to heat transfer, which may be from the refrigeration load, to liquid working fluid on the surface within the pores of a porous wick within an evaporator. Boiling instability is prevented by the use of one or more porous wicks because when the small channels of the porous wick are used to vaporize the liquid working fluid, surface tension forces become large relative to the gravitational force acting on the same body of liquid. The curvature of the vapor liquid interface automatically adjusts to damp out pressure oscillations. The presence of the porous wick or wicks in the evaporator therefore acts as a diode and stabilizes the vapor liquid interface. Two phase flows are difficult to handle because of complex interfacial behavior between the vapor and liquid phases. The porous wick, which represents the only interface between the liquid vapor phases of the working fluid, simplifies the flow scheme to approximate that of a relatively predictable single phase flow thus reducing the potential for flow instability.

The invention will be described in greater detail with reference to the Drawings. Referring now FIG. 1, vaporized working fluid in line 1 is passed to heat exchanger 2 wherein it is condensed by indirect heat exchange with refrigeration generated by refrigerator 3. In the embodiment of the invention illustrated in FIG. 1, the refrigerator is a pulse tube cryocooler. Any effective fluid may be used as the working fluid in the practice of this invention. The preferred working fluid is nitrogen. Other fluids which may be used as the working fluid in the practice of the invention include ammonia, R-22, methane, argon, R134a, ethanol, oxygen, neon, hydrogen and helium. Mixtures comprising one or more of the above-recited fluids may also be used as the working fluid in the practice of the invention.

Any effective refrigerator may be used in the practice of this invention and among such one can name a Gifford-McMahon type cryocooler, a Stirling cryocooler, an MGR refrigerator, a pulse tube cooler, and a pulse tube cryocooler. One preferred cryocooler in the practice of this invention is a pulse tube cryocooler because it has no cold end moving parts and can operate below 77K which is useful for superconductivity applications.

Figure 1:
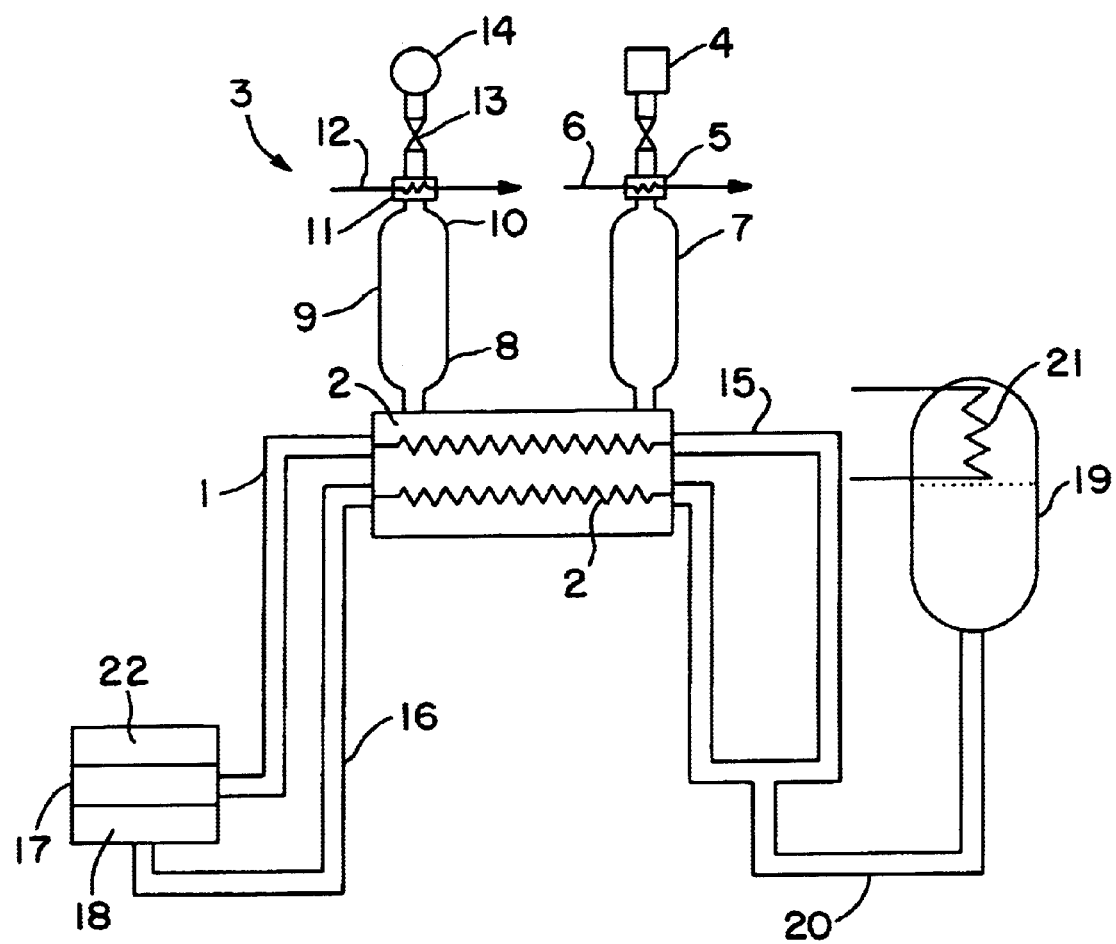
FIG. 1 is a simplified schematic representation of one arrangement for carrying out a preferred embodiment of the method of this invention.

In the arrangement illustrated in FIG. 1 the cryocooler 3 is a pulse tube refrigerator, and the operation of this pulse tube refrigerator will now be described. In the pulse tube refrigerator illustrated in FIG. 1, driver or pressure wave generator 4 may be a piston or some other mechanical compression device, or an acoustic or thermoacoustic wave generation device, or any other suitable device for providing a pulse or compression wave to pulse tube gas. That is, the pulse generator delivers energy to the pulse tube gas causing pressure and velocity oscillations. Helium is the preferred pulse tube gas; however any effective working gas may be used in a pulse tube refrigerator and among such one can name nitrogen, oxygen, argon and neon, or mixtures containing one or more thereof such as air.

The oscillating pulse tube gas is cooled in aftercooler 5 by indirect heat exchange with cooling medium, such as water 6. Pulse tube gas in regenerator 7 is cooled by heat exchange with regenerator media as it moves toward heat exchanger 2.

The geometry and pulsing configuration of the pulse tube refrigerator is such that the oscillating pulse tube gas in heat exchanger 2 and the cold end 8 of the pulse tube 9 expand for some fraction of the pulsing cycle and heat is absorbed by the pulse tube gas by indirect heat exchange which provides refrigeration to condense the working fluid in heat exchanger 2. Refrigeration from the pulse tube gas is passed by indirect heat exchange to the working fluid. Some energy is dissipated in the orifice and the resulting heat is removed from the warm end 10 typically by use of a warm heat exchanger 11 by indirect heat exchange with cooling medium, such as water 12. Preferably the pulse tube refrigeration system employs an orifice 13 and reservoir 14 to maintain the gas displacement and pressure pulses in appropriate phases. The size of reservoir 14 is sufficiently large so that essentially very little pressure oscillation occurs in it during the oscillating flow in the pulse tube.

The condensed working fluid is withdrawn from the heat exchanger and passed into an evaporator containing at least one porous wick. In the embodiment of the invention illustrated in FIG. 1 the condensed working fluid withdrawn from heat exchanger 2 in line or conduit 15 is passed back to heat exchanger 2 wherein it is subcooled by refrigeration generated by cryocooler 3. The subcooled liquid working fluid is then passed in line 16 to evaporator 17 having porous wick 18. Preferably, as illustrated in FIG. 1, evaporator 17 is located at a lower elevation than is heat exchanger 2 so that gravitational force assists in the passage of the condensed working fluid to the evaporator. Moreover the lower elevation results in some pressurization of the liquid working fluid from the heat exchanger to the evaporator due to liquid head, and this pressurization has an additional subcooling effect on the liquid working fluid. The subcooling of the liquid working fluid is advantageous for preventing the liquid working fluid from flashing into vapor before reaching the evaporator.

Preferably a reservoir is used in the practice of this invention to ensure that the evaporator remains primed in spite of changes in heat input from the refrigeration load. In the embodiment of the invention illustrated in FIG. 1, liquid working fluid flows into or out of reservoir 19 in line 20 to compensate for fluctuations in heat load. Reservoir 19 serves to store excess liquid and also serves to control the pressure when the heat input varies. An electric heater 21 can be used for the pressure control function. The reservoir can also be used to ensure that the evaporator wick is primed with liquid working fluid at start up.

A refrigeration load is provided to the evaporator. In FIG. 1 the refrigeration load is shown in representational form by element 22. Any effective refrigeration load may be used in the practice of this invention. For example, the refrigeration load may be fluid which circulates between the evaporator and a piece of equipment which requires cooling such as a freezer or superconducting equipment. Moreover, the refrigeration load provided to the evaporator could be superconducting equipment itself such as electrical cable. The liquid working fluid on the porous wick surface within the evaporator is evaporated by heat from the refrigeration load, thus providing refrigeration to the refrigeration load while also simultaneously generating a capillary pumping force which serves to drive, at least in part, the condensed working fluid from the heat exchanger to the evaporator. The evaporated working fluid is withdrawn from the evaporator and passed back to heat exchanger 2 in conduit 1 and cycle begins anew.

Figure 2:
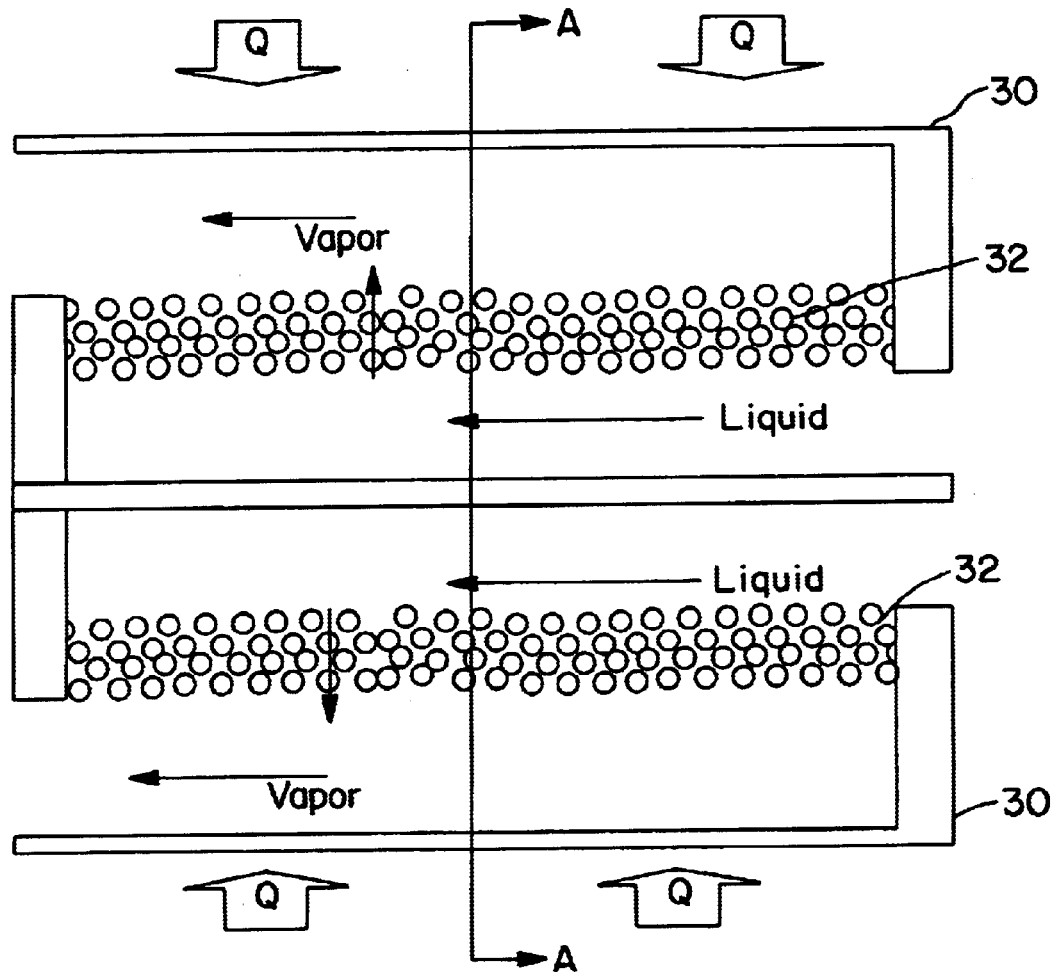
FIG. 2 is a simplified cross sectional representation of one embodiment of the evaporator which may be used in the practice of this invention.
Figure 3:
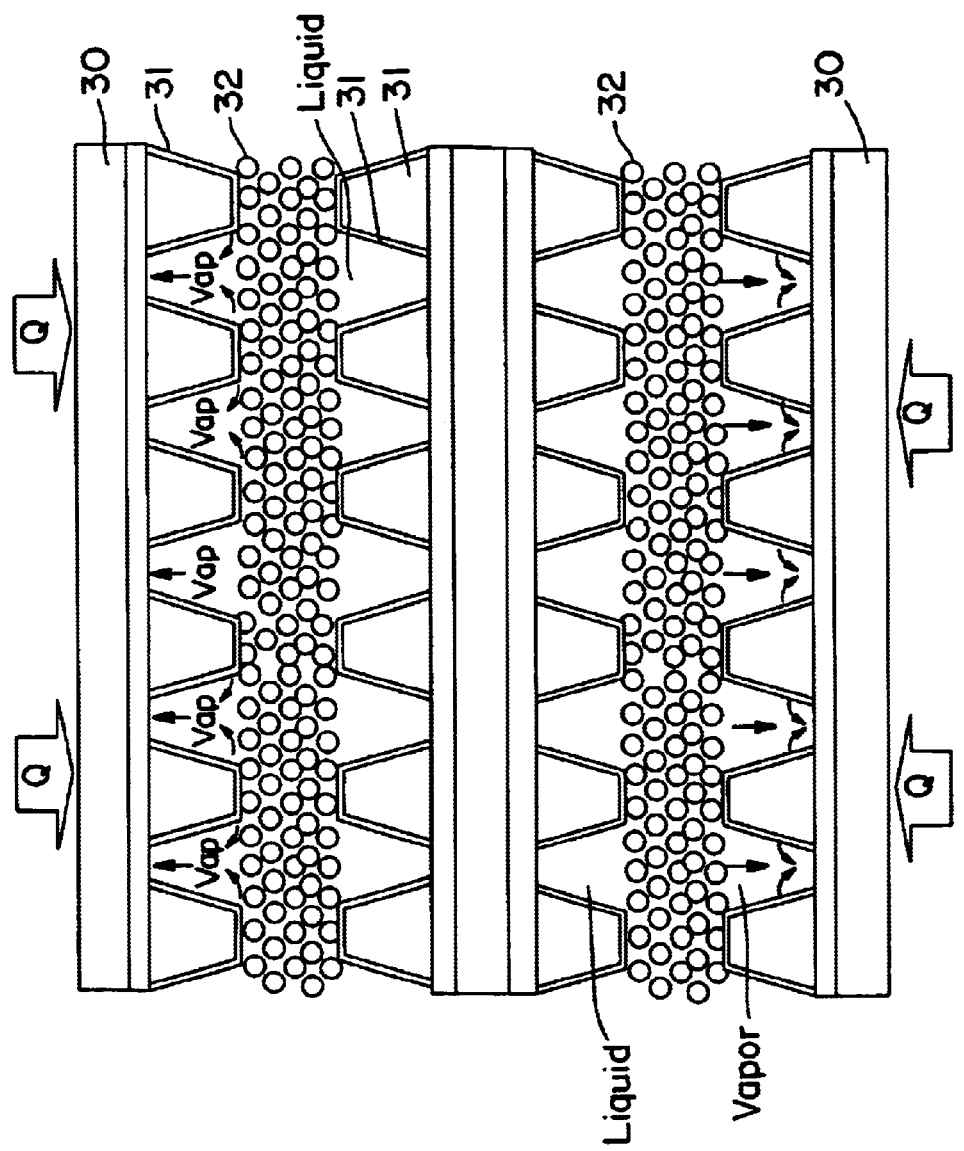
FIG. 3 is a view of the evaporator illustrated in FIG. 2 along line A—A.

The operation of the evaporator will be discussed in greater detail with reference to FIGS. 2 and 3 which illustrate one preferred arrangement wherein the evaporator is coaxial. Referring now to FIGS. 2 and 3, refrigeration load Q is provided to the evaporator which comprises a plate 30 with fins or extrusions 31 that have a leading edge very close or touching the surface of porous wick 32 and may even be embedded some distance into the porous wick. The condensed working fluid flows in a finned volume as shown by the arrows labeled "liquid" in FIGS. 2 and 3, to the porous wick and onto the porous wick surface whereon the aforedescribed heat exchange and evaporation takes place. The fins form channels that allow the resulting vaporized working fluid to flow from the porous wick and out of the evaporator as shown by the arrows labeled "vapor" or "vap" in FIGS. 2 and 3. This design is advantageous because heat is transferred directly from the refrigeration load to the liquid surface rather than from the load through the wick/liquid to the liquid surface as in a conventional heat pipe.

The evaporation process provides the capillary pumping force for the process. The maximum capillary pumping force or head can be estimated from the Young-Laplace equation:

$$\text{maximum liquid height} = \frac{2\sigma}{R_\sigma \rho_L g}$$

Where,
$\rho_L$=Liquid density (kg/m$^3$)
g=gravitational acceleration (=9.81 m/s$^2$)
$\sigma$=Surface Tension (N/m$^2$)
$R_o$=Capillary pore radius (m)

In the practice of this invention the evaporator may be constructed as a plate-fin heat exchanger, i.e. plates, tins and wick material are stacked then brazed in a furnace, but can be any required shape such as a plate-type evaporator or tubular evaporator. The refrigeration load may be provided to the evaporator from the top, from the sides, from below or any combination of these. The porous wick material is preferably metal such as stainless steel or aluminum. Other materials which may be used to form the porous wick for use in the practice of this invention include copper, nickel, titanium, ceramic, silicon, polyethylene and fluorocarbon polymers. The preferred structure of the porous wick is metal foam. Other structures for the porous wick in the practice of this invention include sintered powder, wire mesh or screen, felted metal or ceramic and formed polyethylene or fluorocarbon polymer. Composite wicks, i.e. a combination of two or more the above-recited structures, may also be used. Generally the porous wick will have a large number of small pores which connect from the liquid side to the vapor side. Preferably the pores have a diameter less than 0.5 millimeter. The wick can be a two stage wick which is useful when more than one evaporator is connected in parallel to a single cryocooler. For a metal foam wick and liquid nitrogen working fluid the capillary pumping force, expressed as liquid head, determined from the Young-Laplace equation set forth above is generally within the range of from 10 to 20 centimeters.

Figure 4:
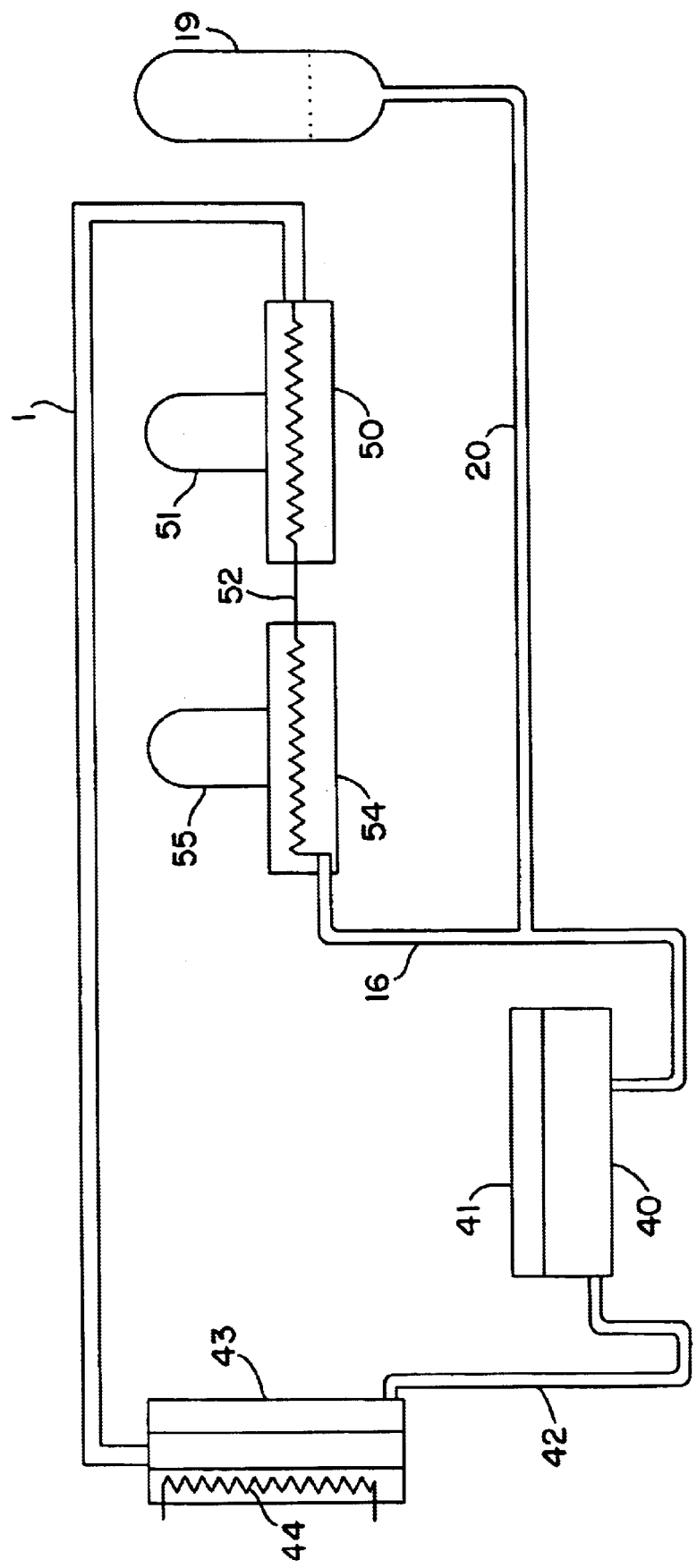
FIG. 4 is a simplified schematic representation of another arrangement for carrying out a preferred embodiment of the method of this invention.

FIG. 4 illustrates another embodiment of the invention which employs a circulating loop with driving assistance provided by an electric heater. The numerals in FIG. 4 correspond to those of FIG. 1 for the common elements, and these common elements will not be described again in detail. The embodiment illustrated in FIG. 4 is particularly useful if the component or refrigeration load to be cooled must be maintained at cryogenic temperature, but does not generate a significant amount of heat. In this case the largest heat input will be from the heat leak into the system. Since heat leak is dispersed around the system, the heat source cannot be combined into a single evaporator. It is necessary to provide a sufficiently high flow of liquid working fluid so that the component, such as an electric motor or wire, is always immersed in liquid. In this way the temperature of the component to be cooled is guaranteed. The circulating evaporator may be electrically heated to complete the evaporation of the working fluid. Coaxial support lines may be an advantage in this application because heat leak prior to the evaporator needs to be minimized.

Referring now to FIG. 4, working fluid in line 1 is passed to heat exchanger 50 wherein it is at least partially condensed by refrigeration provided by a refrigerator such as cryocooler 51. The resulting working fluid, which may be totally or partially in the liquid phase, is passed in line 52 to heat exchanger 54 wherein any remaining vapor is condensed and the working fluid is subcooled by refrigeration provided by a refrigerator such as cryocooler 55. The condensed and subcooled working fluid is passed from heat exchanger 54 to bath 40 wherein it is used to keep component 41 at a cold or cryogenic temperature, preferably by bathing component 41 in the working fluid. The resulting working fluid is passed in line 42 to evaporator 43 containing a porous wick and wherein the liquid working fluid is evaporated by heat input from electrical heater 44. The evaporator functions and the evaporation proceeds in a manner similar to that described above with reference to FIGS. 1–3, and the evaporated working fluid is returned to heat exchanger 50 in line 1.

Although the invention has been described in detail with reference to certain preferred embodiments, those skilled in the art will recognize that there are other embodiments of the invention within the spirit and the scope of the claim. For example, one may employ coaxial vapor and liquid conduits, multiple evaporators, multiple cryocoolers, a reservoir connected to the evaporator, and/or a reservoir integral with the cryocooler.

What is claimed is:

1. A method for providing refrigeration to a refrigeration load comprising:
   (A) generating refrigeration using a cryocooler and using the refrigeration to condense working fluid in a heat exchanger, withdrawing the condensed working fluid from the heat exchanger, and passing the condensed working fluid back to the heat exchanger wherein it is subcooled by refrigeration generated by the cryocooler;
   (B) passing the condensed and subcooled working fluid into an evaporator which is at a lower elevation than the heat exchanger, said evaporator comprising a porous wick having a surface, providing a refrigeration load to the evaporator, flowing condensed working fluid onto the wick surface, and evaporating condensed working fluid from the wick surface to provide refrigeration to the refrigeration load and to generate a capillary pumping force; and
   (C) withdrawing evaporated working fluid from the evaporator, wherein the condensed working fluid is passed to the evaporator at least in part by the capillary pumping force from the evaporation of the condensed working fluid from the wick surface.

2. The method of claim 1 further comprising passing liquid cryogen from a reservoir to the evaporator.

3. The method of claim 1 wherein the evaporator is a plate-fin heat exchanger comprising a plurality of fins and heat from the refrigeration load is provided through the fins to the porous wick.

4. The method of claim 1 wherein the porous wick comprises a plurality of pores each having a diameter less than 0.5 millimeter.

5. The method of claim 1 wherein the porous wick comprises metal.

6. The method of claim 5 wherein the porous wick comprises metal foam.

7. The method of claim 1 wherein the working fluid comprises nitrogen.

8. A method for providing refrigeration to a refrigeration load comprising:
   (A) generating refrigeration using a cryocooler and using the refrigeration to condense working fluid in a heat exchanger, withdrawing the condensed working fluid from the heat exchanger, and passing the condensed working fluid to another heat exchanger wherein it is subcooled using refrigeration provided by another cryocooler;
   (B) providing refrigeration from the condensed and subcooled working fluid to the refrigeration load while keeping the refrigeration load immersed in liquid working fluid, and thereafter passing the condensed working fluid into an evaporator comprising a porous wick having a surface, flowing condensed working fluid onto the wick surface, and evaporating condensed working fluid from the wick surface to generate a capillary pumping force; and (C) withdrawing evaporated working fluid from the evaporator, wherein the condensed working fluid is passed to the evaporator at least in part by the capillary pumping force from the evaporation of the condensed working fluid from the wick surface.

9. The method of claim 8 further comprising passing liquid cryogen from a reservoir to the evaporator.

10. The method of claim 8 wherein the condensed working fluid is evaporated in the evaporator by heat provided by an electric hater.

11. The method of claim 10 wherein the evaporator is a plate-fin heat exchanger comprising a plurality of fins and heat from the electric heater is provided through the fins to the porous wick.

12. The method of claim 8 wherein the porous wick comprises a plurality of pores each having a diameter less than 0.5 millimeter.

13. The method of claim 8 wherein the porous wick comprises metal.

14. The method of claim 13 wherein the porous wick comprises metal foam.

15. The method of claim 8 wherein the working fluid comprises nitrogen.

* * * * *